United States Patent
Cadien et al.

[11] Patent Number: 5,604,158
[45] Date of Patent: Feb. 18, 1997

[54] INTEGRATED TUNGSTEN/TUNGSTEN SILICIDE PLUG PROCESS

[75] Inventors: Kenneth C. Cadien, Portland, Oreg.; Srinivasam Sivaram, San Jose, Calif.

[73] Assignee: Intel Corporation, Santa Clara, Calif.

[21] Appl. No.: 632,751

[22] Filed: Apr. 16, 1996

Related U.S. Application Data

[63] Continuation of Ser. No. 40,657, Mar. 31, 1993, abandoned.
[51] Int. Cl.$^6$ .................................................... H01L 21/44
[52] U.S. Cl. .......................... 437/200; 437/192; 437/190; 156/636.1
[58] Field of Search .................................... 437/200, 192, 437/228 POL, 190; 156/636.1, 645.1; 257/770

[56] References Cited

U.S. PATENT DOCUMENTS

| | | | |
|---|---|---|---|
| 3,664,874 | 5/1972 | Epstein . | |
| 4,702,792 | 11/1987 | Chow et al. . | |
| 4,758,306 | 7/1988 | Cronin et al. . | |
| 4,944,836 | 7/1990 | Beyer et al. . | |
| 4,954,142 | 9/1990 | Carr et al. . | |
| 4,960,732 | 10/1990 | Dixit et al. . | |
| 4,992,135 | 2/1991 | Doan | 156/636 |
| 5,183,782 | 2/1993 | Onishi et al. . | |
| 5,232,872 | 8/1993 | Ohba . | |
| 5,244,534 | 9/1993 | Yu et al. | 156/636 |
| 5,340,370 | 8/1994 | Cadien et al. | 51/308 |
| 5,354,712 | 10/1994 | Ho et al. | 437/195 |

OTHER PUBLICATIONS

Howard Landis, et al. "Integration of chemical–mechanical polishing into CMOS integrated circuit manufacturing" Thin Solid Films 220 (1992) pp. 1–7.

Sivaram, S., et al. "Underlayer Dependence of Thin Film Stresses in Blanket CVD Tungsten", Tungsten and Other Refractory Metals for VLSI 1988 Materials Res. Soc. pp. 407–414.

D. Liao, L. Patterson, S. Sivaram, and K. Suh, "Planarized Contact Process for Submicron VLSI Devices Using Resist Etch Back of CVD Tungsten", Abstract Number 251, Submicron Technology Development, Intel Corporation, Santa Clara.

Sivaram, S. et al, "Underlayer Dependence Of Thin Film Stresses In Blanket CVD Tungsten", *Tungsten and Other Refractory Metals for VLSI Applications III* 1988 Materials Research Society, pp. 407–414.

Kaufman, F. et al, "Chemical–Mechanical Polishing For Fabricating Patterned W Metal Features as Chip Interconnects" *Journal of Electrochemical Society*, vol. 138, No. 11 Nov. 1991, pp. 3460–3464.

*Primary Examiner*—George Fourson
*Assistant Examiner*—C. Everhart
*Attorney, Agent, or Firm*—Blakely, Sokoloff, Taylor & Zafman

[57] ABSTRACT

A method of filling an opening in an insulating layer of an integrated circuit. First a tungsten-silicide layer is deposited over the opening. Next a tungsten layer is deposited onto the tungsten-silicide layer such that the opening is substantially filed with tungsten. The tungsten and tungsten-silicide layer are then chemically-mechanically polished back until the insulating layer is substantially revealed.

18 Claims, 4 Drawing Sheets

INTEGRATED TUNGSTEN/TUNGSTEN SILICIDE PLUG PROCESS

This is a continuation of application Ser. No. 08/040,657, filed Mar. 31, 1993 now abandoned.

BACKGROUND OF THE INVENTION

1. Field of the Invention

The present invention relates to the field of semiconductor circuit manufacturing, and more specifically, to a method of forming an electrical connection between conductive layers of a semiconductor device.

2. Description of Relevant Art

Integrated circuits are made up of literally millions of active devices formed in or on a silicon substrate or well. The active devices are interconnected together in order to form functional circuits and components from the devices. The devices are interconnect together through the use of multilevel interconnects. A cross-sectional illustration of a typical multilevel interconnect structure 100 is shown in FIG. 1. Interconnect structures normally have a first level of metallization or interconnect layer 102 (typically aluminum alloys or tungsten), a second level of metallization 104 and sometimes a third or even fourth level of metallization. Interlevel dielectrics 106 (ILDs) such as silicon dioxide ($SiO_2$) are used to electrically isolate different levels of metallization and silicon substrate or well 108. The electrical connections between different interconnect levels are made through the use of metalized vias 110 formed in ILD 106. In a similar manner, metal contacts 112 are used to form electrical connections between interconnect levels and devices formed in well 108. The metal vias 110 and contacts 112, herein after being commonly referred to as "vias", are generally filled with tungsten 114 and generally have a titanium nitride (TiN) barrier layer 116. Titanium nitride barrier layer 116 provides an adhesion layer for tungsten metal 114. It is to be appreciated that tungsten exhibits poor adhesion to materials such as oxides, metals, silicon, and silicides.

A problem with metalized vias 110 and 112 is that the titanium nitride (TiN) adhesion layer is formed by sputtering. Sputter processes classically exhibit poor step coverage 118 as shown in FIG. 1. Poor step coverage in vias translates into reliability (open circuits) and performance (increased resistance) problems for the interconnect structure. Step coverage becomes worse and reaches an unacceptable level as via dimensions decrease in order to facilitate higher density circuits. The problem is especially compounded when small dimensioned vias with vertical side walls are formed. Sputtered titanium nitride barrier layers can only be reliably used in vias with aspect ratios less than about 3.0. Sputtered titanium nitride barrier layers are incompatible with future ultra large scale integrated (ULSI) circuits which will require vias with aspect ratios >4.0.

A chemical vapor deposited (CVD) titanium nitride adhesion layer has been suggested as a substitute for the sputtered titanium nitride adhesion layer. CVD processes generally exhibit better step coverage than do sputter processes. Unfortunately, CVD titanium nitride requires a $TiCl_4$ high temperature process (700° C.). Such a high temperature process is incompatible with some layers utilized in multilevel metallization schemes. Additionally, chlorine from $TiCl_4$ can be incorporated into the barrier layer and detrimentally affect its quality. Still further, CVD titanium nitride is a relatively new and untested process which requires new and elaborate machinery.

As an alternative to titanium nitride adhesion layers, tungsten silicide ($WSi_x$) adhesion layers have been proposed. Unfortunately, a tungsten via formed with a tungsten silicide adhesion layer suffers from "etch out" as shown in FIG. 2. (See "Underlying Dependence Of Thin Film Stresses In Blanket CVD Tungsten", *Tungsten and Other Refractory Metals for VLSI Applications III;* Published by Materials Research Society: 1988, pgs. 407–414.) That is, presently there is no plasma etch chemistry which can be used to etch back the tungsten layer which does not preferentially attack the tungsten silicide adhesion layer and cause etch out. If the adhesion layer is etched away, the tungsten metal can "pop out" and cause a failure. Another problem with the plasma etchback process shown in FIG. 2 is that the tungsten metals 204 can become recessed into the via hole during etchback. Such a recessed plug can adversely effect the planarization of subsequently formed interconnect layers. Thus, the use of a tungsten via in conjunction with a tungsten silicide adhesion layer is presently an unreliable process.

Thus, what is desired is a method of forming a reliable tungsten plug which can be used in modem, high density, multilevel integrated circuits.

SUMMARY OF THE INVENTION

A novel method of forming a tungsten contact through an insulating layer to a conductive layer is described. First, an insulating layer, such as $SiO_2$, is formed over the conductive layer to which the contact is to be formed. The conductive layer can be a variety of conductive materials used in semiconductor manufacturing including, but not limited to, aluminum alloys, tungsten, polysilicon, silicide, and silicon. The insulating layer is then patterned with well-known techniques to form an opening through the insulating layer to the conductive layer. Next, a tungsten-silicide adhesion layer is conformly formed on the insulating layer, on the sides of the opening, and on the conductive layer in the bottom of the opening. The tungsten-silicide layer can be formed by CVD utilizing a silane reduction of $WF_6$. Next, a tungsten layer is blanket deposited over the tungsten-silicide layer wherein the opening becomes completely filled with tungsten. The tungsten layer can be formed by CVD utilizing a hydrogen reduction of $WF_6$. The tungsten layer and the tungsten-silicide layers on the top surface of the insulating layer are then chemically-mechanically polished back until the insulating layer is substantially revealed. In this way, a tungsten plug which is substantially planar with the top surface of the insulating layer is formed. Finally, an interconnect line is formed on the insulating layer and on the tungsten plug so that an electrical connection is made between the conductive layer and the interconnect line.

An object of the present invention is to form a reliable, high density, high performance, planar contact between two conductive layers of an integrated circuit.

Another object of the present invention is to provide a process for forming a tungsten plug utilizing a tungsten-silicide adhesion layer wherein the plug does not suffer from etch out.

Still another object of the present invention is to provide a process for forming a tungsten plug in a high aspect ratio via hole.

Still yet another object of the present invention is to provide an inexpensive process for forming a tungsten plug which does not require new or untested machinery and/or processes.

Other objects and advantages of the present invention will become obvious from the detailed description which follows.

BRIEF DESCRIPTION OF THE DRAWINGS

FIG. 3b is an illustration of a cross-sectional view showing the formation of a tungsten-silicide layer on the substrate of FIG. 3a.

DETAILED DESCRIPTION OF THE PRESENT INVENTION

A novel tungsten plug process for high density integrated circuits is described. In the following description numerous specific details are set forth, such as specific materials thicknesses and types, in order to provide a thorough understanding of the present invention. It will be obvious, however, to one skilled in the art that the present invention may be practiced without these specific details. In other instances, other well-known semiconductor processes and machinery have not been described in particular detail in order to avoid unnecessarily obscuring the present invention.

The present invention is a novel process for filling a groove or opening formed in an interlayer dielectric with tungsten. The process is especially useful for forming vias between metallization layers and contacts between metallization layers and active devices formed in a semiconductor substrate or well. The teachings of the present invention may also be applied to the formation of interconnect lines in an integrated circuit.

Figure 1:
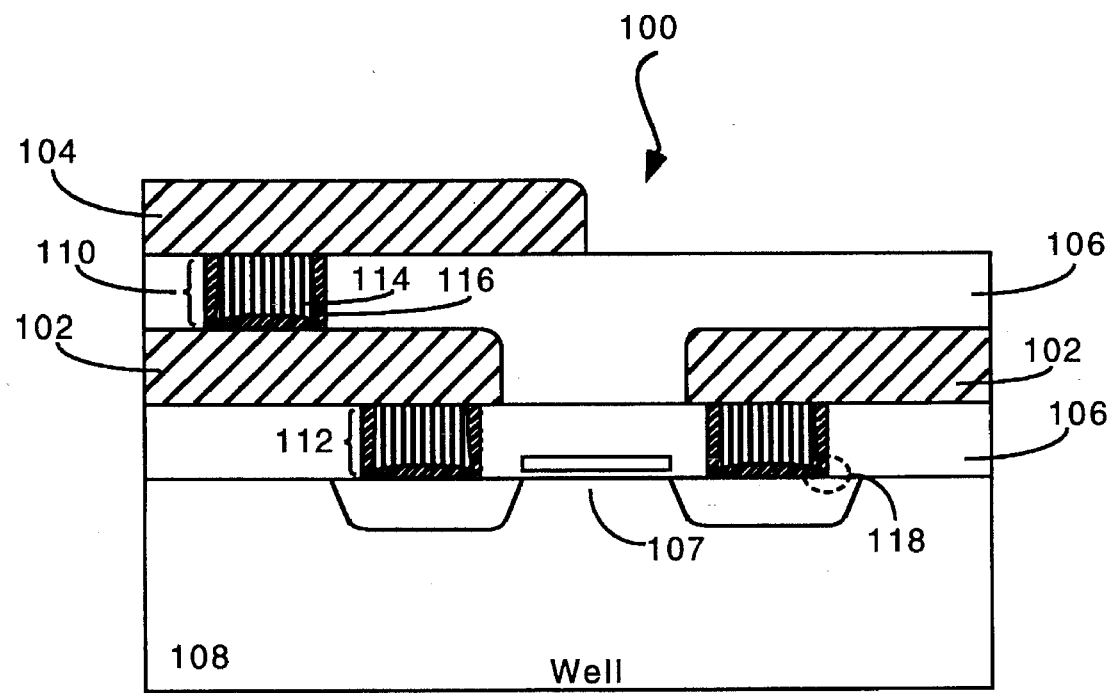
FIG. 1 is an illustration of a cross-sectional view of a prior art interconnect structure utilizing low aspect ratio via comprising a tungsten plug and a sputtered TiN adhesion layer.
Figure 2:
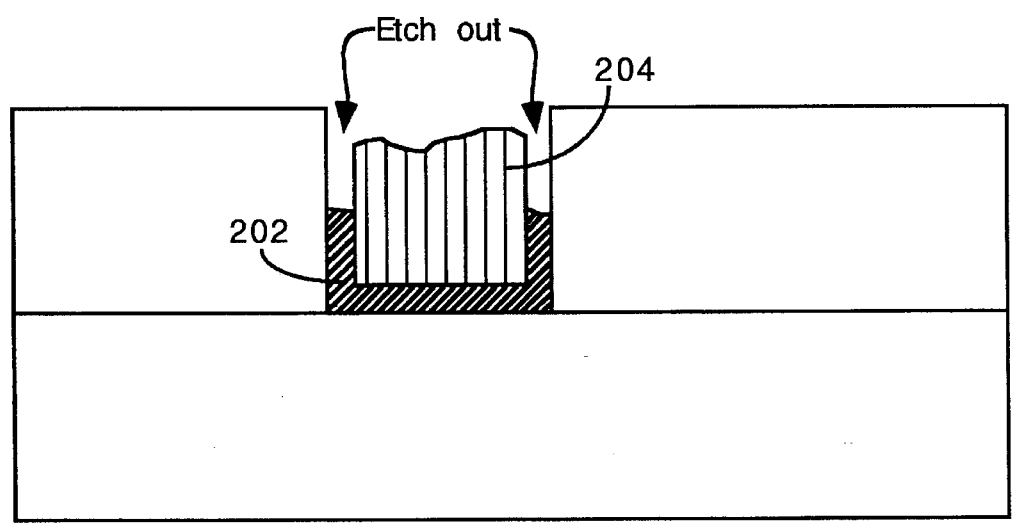
FIG. 2 is an illustration of a cross-sectional view of a tungsten plug utilizing a tungsten-silicide barrier layer wherein the plug has been "etched out" during plasma etchback.
Figure 3A:
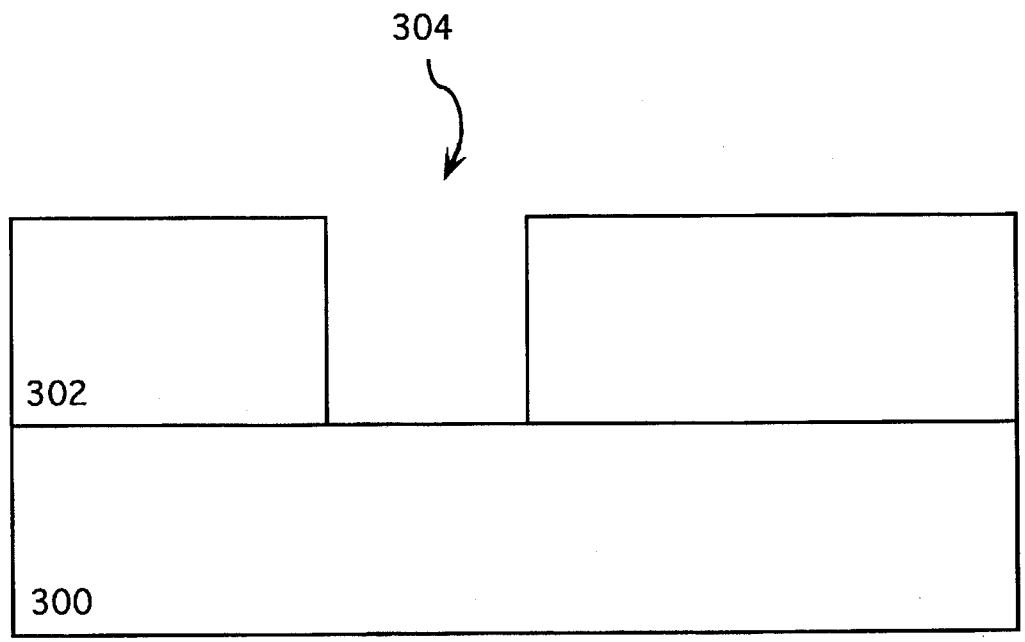
FIG. 3a is an illustration of a cross-sectional view of a substrate showing a via hole formed through an insulating layer to a conductive layer.

In the fabrication of a contact or via connection to an underlying conductive layer, first the conductive layer is formed as shown in FIG. 3a. The conductive layer 300 can be a variety of conductive materials used in semiconductor circuit manufacturing including but not limited to a metal layer, a semiconductor such as silicon, a doped semiconductor, a polysilicon layer, or a metal silicide layer. Next, an interlayer dielectric (ILD) 302 is formed over the conductive layer 300. Interlayer dielectric 302 is an insulating layer which is typically silicon dioxide ($SiO_2$). Other insulating layers, such as silicon nitride, or multilayer composite dielectrics, including such things as spin on glass, may also be used. Insulating layer 302 electrically isolates conductive layer 300 from a subsequently formed conductive layer.

Next, an opening or via hole 304 is formed in interlayer dielectric 302. A photoresist layer is masked, exposed, and developed to define the location for the via hole. The insulating layer is then anisotropically etched with techniques well-known in the art to form via hole 304. Via hole 304 is etched until conductive layer 300 is reached. A via hole with substantially vertical side walls and a large aspect ratio (aspect ratio=via depth/via width) is desired. Such a via hole is compatible with the high packing density required for future ultra large scale integrated (ULSI) circuits.

Figure 3B:
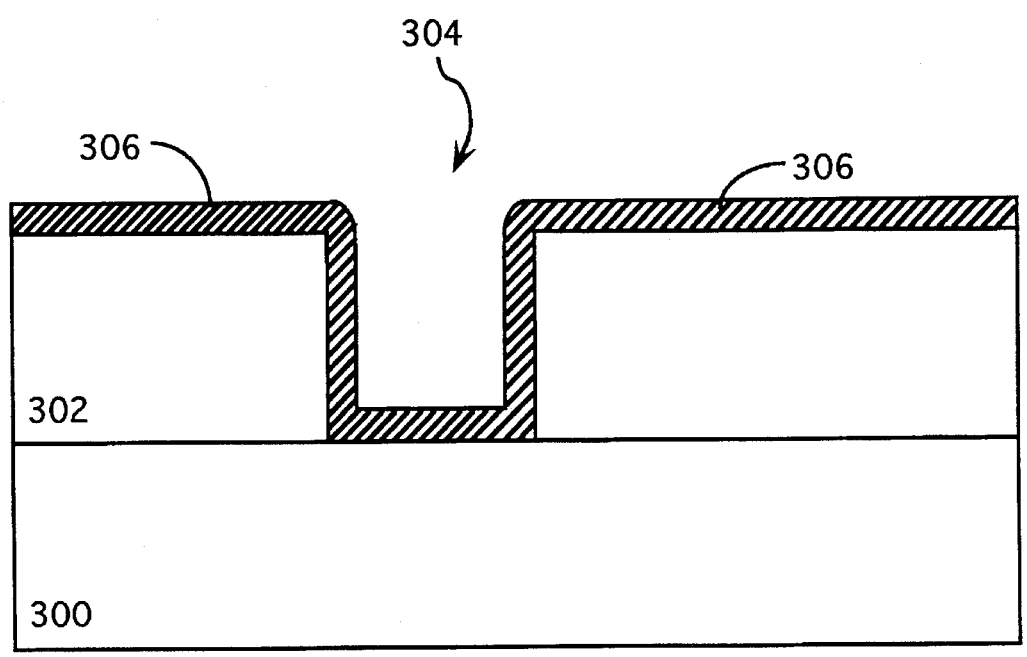

Next, as shown in FIG. 3b, a tungsten-silicide ($WSi_x$, wherein x>2 and typically 2.6) layer 306 is blanket deposited over ILD 302. Tungsten-silicide layer 306 is formed to a thickness <1000Å. Tungsten-silicide layer 306 can be formed with a low temperature chemical vapor deposition (CVD) process at 375°–425° C. utilizing approximately 400 sccm of Argon, 450 sccm of Silane, and 3.5 sccm of $WF_6$. An Applied Materials Precision 5000 deposition system can be used for depositing tungsten-silicide layer 306. The low temperature processing of the present invention is compatible with materials used in multilevel interconnect structures. Tungsten-silicide layer 306 is a conformal layer which forms uniformly on the top of ILD 302, on the sides of via hole 304, and on conductive layer 300 in via hole 304. Tungsten-silicide layer 306 exhibits excellent step coverage inside high aspect ratio via hole 304. Tungsten-silicide layer 306 acts as an adhesion layer for a subsequently formed tungsten layer. Tungsten-silicide adheres well to interlayer dielectrics such as $SiO_2$. Additionally, tungsten-silicide forms a good electrical contact with and adheres well to silicides such as titanium silicide, to silicon, to aluminum alloys, and to tungsten.

Figure 3C:
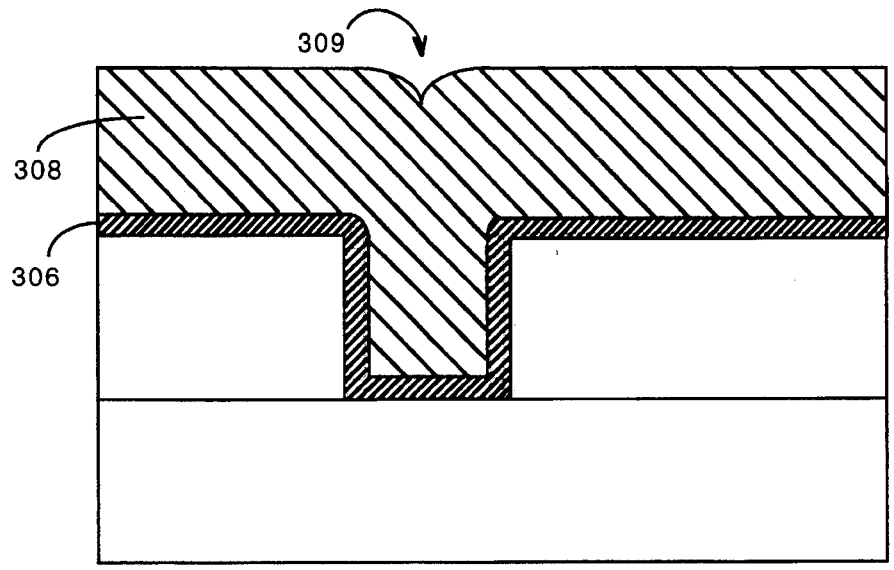
FIG. 3c is an illustration of a cross-sectional view showing the formation of a tungsten layer on the substrate of FIG. 3b.

Next, as shown in FIG. 3c, a tungsten layer 308 is blanket deposited over tungsten-silicide layer 306. The deposition completely fills via hole 304 with tungsten. The deposition forms a thick tungsten layer over ILD 302. A slight dimple 309 may result in the top portion of tungsten layer 308 over via hole 304. Tungsten layer 308 is formed to a thickness of approximately 8500Å for an 8000Å diameter plug. Tungsten layer 308 can be formed by CVD using hydrogen ($H_2$) reduction of tungsten hexafluoride ($WF_6$) wherein the ratio of $H_2$ to $WF_6$ is approximately 7:1. The tungsten layer adheres well to underlying tungsten-silicide layer 306 and forms a good ohmic contact with conductive layer 300. An Applied Materials Precision 5000 deposition system can be used for depositing tungsten layer 308.

It is to be noted that an advantage of the present invention is that the formation of tungsten layer 308 and tungsten-silicide adhesion layer 306 can be done "in-situ". That is, the tungsten layer 308 can be deposited in the same chamber as the tungsten-silicide adhesion layer without the need to break vacuum. Tungsten layer 308 and tungsten-silicide layer 306 may also be formed, if desired, in a tungsten cluster tool having a $WSi_x$ deposition chamber and a tungsten deposition chamber.

It is to be appreciated that the use of tungsten-silicide adhesion layer eliminates the need for a tungsten nucleation layer. That is, if a TiN adhesion layer were utilized instead of a $WSi_x$ adhesion layer, the formation of tungsten layer 308 would require the formation of a nucleation layer first. (It is to be appreciated that silane ($SiH_4$) used to form the $WSi_x$ adhesion layer 306 is already supplied to the deposition system because it was required to form the nucleation layer for the tungsten layer.) Thus, in the process of the present invention a tungsten-silicide deposition step is added while a tungsten nucleation step is eliminated.

Figure 3D:
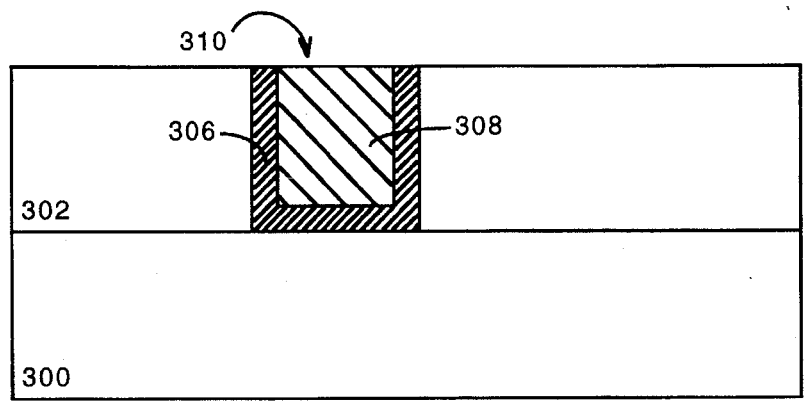
FIG. 3d is an illustration of a cross-sectional view showing the formation of a planar tungsten plug by chemically-mechanically polishing the substrate of FIG. 3c.
Figure 4:
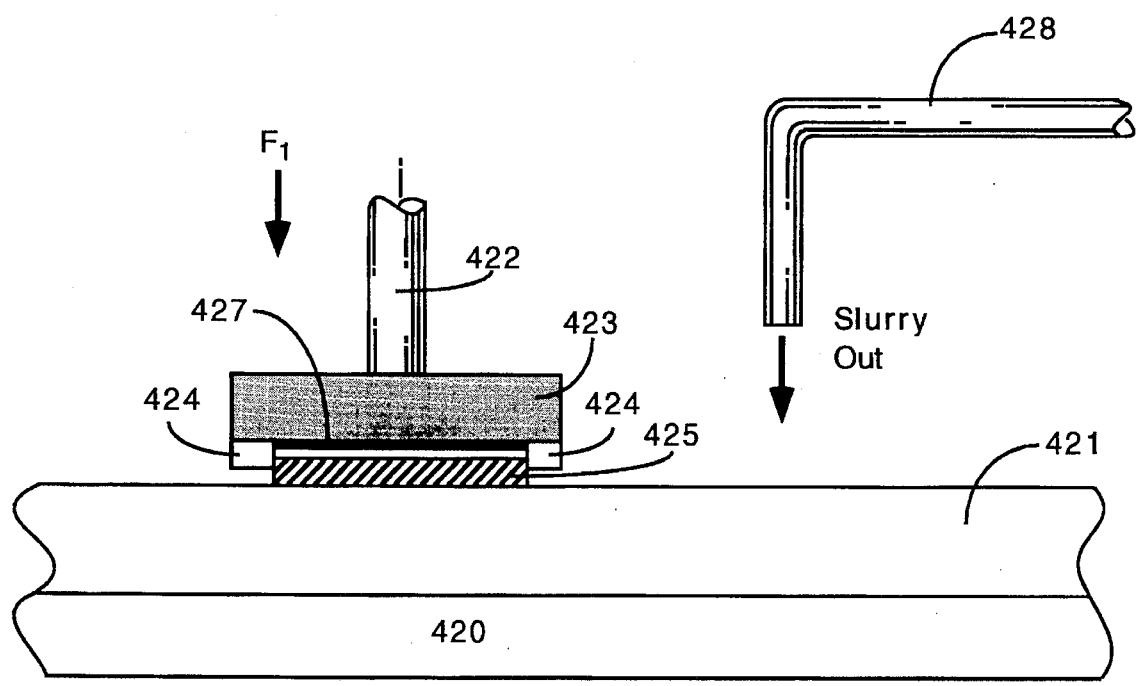
FIG. 4 illustrates a chemical mechanical polishing process.

Next, as shown in FIG. 3d, the tungsten layer 308 and the tungsten-silicide layer 306 on the top surface of ILD 302 are chemically-mechanically polished back. In a chemical-mechanical polish process, as shown in FIG. 4, a silicon substrate 425 is placed face down on pad 421 which is fixedly attached to the upper surface of table 420. In this manner, the thin-film to be polished, i.e. tungsten, is placed in direct contact with the upper surface of pad 421. Pad 421 comprises a relatively hard polyurethane or similar material capable of transporting an abrasive particulate matter such as silica particles commonly referred to as "slurry". Carrier 423, also know as a "quill", is used to apply a downward pressure F1 against the back side of substrate 425. The back side of substrate 425 is held in contact with the bottom of carrier 423 by a vacuum or a wet surface tension preferably an insert pad 427, cushions wafer 425 from carrier 423. An ordinary retaining ring 424 is employed to prevent wafer 425 from slipping laterally from beneath carrier 423 during processing. The applied pressure F1 is typically on the order of 5 lbs/sq. inch and is applied by means of a shaft 422 attached to the back side of carrier 423. This pressure is used to faciliate the abrasive polish of the upper surface of the thin film. Shaft 422 may also rotate to impart rotational movement to substrate 425. This greatly enhances the polishing process. A pad conditioning assembly can be utilized, if desired, to condition the pad during polishing.

During polishing operations, carrier 423 typically rotates in a circular motion relative to table 420. As table 420 and carrier 423 are rotated, slurry is dispensed or pumped through pipe 428 onto the upper surface of pad 421. A slurry such as a mixture of potassium ferricyanide and colloidal silica with the pH adjusted to a value less than 6.2 can be used in the present invention to chemically-mechanically polish tungsten layer 308 and tungsten silicide layer 306. During the polishing process the slurry particles become embedded in the upper surface of pad 421. The relative rotation movements of carrier 423 and table 420 then facilitate the polishing of the tungsten and tungsten silicide layers.

The abrasive polishing of tungsten layer 308 and tungsten-silicide layer 306 is continued in this manner until ILD 302 is reached. At the completion of the polishing process, a filled via hole or tungsten plug 310 is formed which is substantially planar with the top surface of ILD 302. Additionally, it is to be stressed that in the present invention tungsten plug 310 does not suffer from "etch out". That is, tungsten-silicide adhesion layer 306 inside the via hole is not preferentially etched as in a plasma etchback process. As a result of the present invention a planar tungsten plug 310 with excellent (ohmic) contact and adhesion to an underlying conductive layer is formed.

Figure 3E:
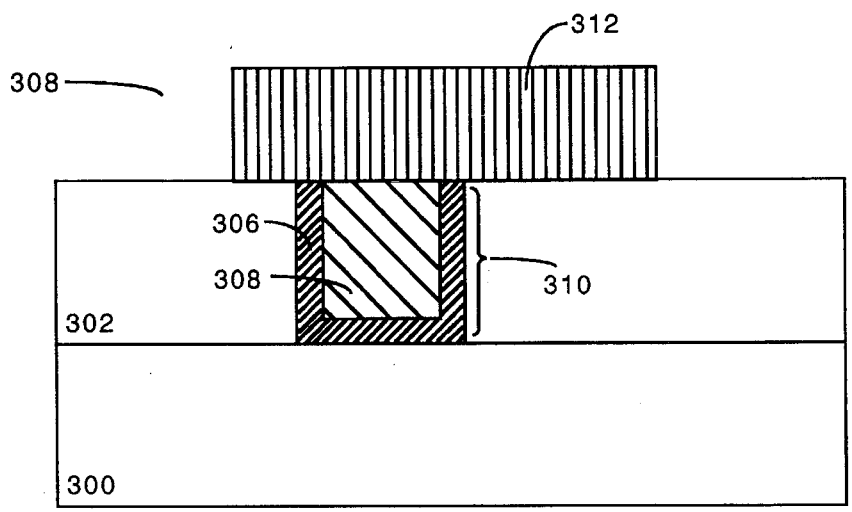
FIG. 3e is an illustration of a cross-sectional view showing the formation of an interconnect line on the insulating layer and on the tungsten plug of the substrate of FIG. 3d.

Next, as shown in FIG. 3e, an interconnect line 312 is formed on ILD 302 and on tungsten plug 310. Interconnect line 312 can be formed by blanket depositing a conductive layer of, for example, aluminum alloys, tungsten, copper, etc., over ILD 302 and tungsten plug 310. The conductive layer is then covered by a photoresist layer which is then masked, exposed, and developed with processes well known in the art, to define the location of interconnect 312. The conductive layer is then etched to form interconnect line 312. It is to be appreciated that interconnect line 312 is substantially planar due to the planar plug formed by the present invention. The fabrication of a planar, highly reliable, high performance, high density electrical connection between two conductive layers of an integrated circuit is now complete.

It is to be appreciated that the teachings of the present invention can be applied to fill-in grooves other than contacts or vias. For example, the teachings of the present invention can be applied to the formation of a tungsten interconnect layer. In this embodiment, an insulating layer is patterned to provide openings or grooves where interconnect lines are to be formed. A tungsten silicide layer is then formed over the insulating layer and into the grooves covering the sides and the bottom of the groove. A tungsten layer is then formed over the tungsten silicide layer and deposited until the grooves are substantially filled. The tungsten and tungsten silicide layer on the top surface of the insulating layer are then chemically-mechanically polished back as before. The result is a planar, reliable, tungsten interconnect layer.

Thus, a novel process for forming a reliable, planar, tungsten plug or interconnect layer for an integrated circuit has been described.

We claim:

1. A process for filling an opening in an insulating layer of an integrated circuit formed over a substrate comprising the steps of:

forming a tungsten silicide layer in said opening and over said insulating layer;

forming a tungsten layer on said tungsten-silicide layer in said opening and over said insulating layer such that said opening is substantially filled with tungsten; and polishing said tungsten and said tungsten-silicide layers until said insulating layer is substantially revealed.

2. The process of claim 1 wherein said tungsten silicide layer is formed by chemical vapor deposition.

3. The process of claim 1 wherein said tungsten layer is formed by chemical vapor deposition.

4. A method of forming a contact to a conductive layer through an insulating layer in an integrated circuit comprising the steps of:

forming an opening through said insulating layer to said conductive layer;

forming a tungsten silicide layer on said conductive layer in said opening, on the sides of said opening and on the top surface of said insulating layer;

forming a tungsten layer on said tungsten silicide layer in said opening, and on said tungsten silicide layer on said insulating layer wherein said opening is substantially filled with tungsten; and polishing back said tungsten layer and said tungsten silicide layer on said insulating layer until said insulating layer is substantially revealed, such that said filled opening is substantially planar with said insulating layer.

5. The method of claim 4 wherein said tungsten silicide layer is formed by chemical vapor deposition.

6. The method of claim 5 wherein said CVD tungsten silicide layer is formed by a silane reduction of $WF_6$.

7. The method of claim 4 wherein said tungsten layer is formed by chemical vapor deposition.

8. The method of claim 7 wherein said CVD tungsten layer is formed by a hydrogen reduction of $WF_6$.

9. The method of claim 4 wherein said tungsten-silicide layer and said tungsten layer are formed in-situ.

10. The method of claim 4 wherein said tungsten-silicide layer and said tungsten layer are formed in a cluster tool having a tungsten-silicide deposition chamber and a tungsten deposition chamber.

11. The method of claim 4 wherein said conductive layer is a metal layer.

12. The method of claim 4 wherein said conductive layer is a semiconductor.

13. The method of claim 4 wherein said conductive layer is a polysilicon layer.

14. The method of claim 4 further comprising the steps of:

forming a second conductive layer on said insulating layer and on said tungsten filled opening such that electrical connection is made between said first and said second conductive layers.

15. A method of forming an interconnection in an insulating layer of an integrated circuit formed over a substrate comprising the steps of:

forming a groove in said insulating layer;

forming a tungsten silicide layer over said insulating layer, over the bottom of said groove and over the sides of said groove;

forming a tungsten layer on said tungsten-silicide layer over said insulating layer and in said groove such that said groove is substantially filled with tungsten; and polishing said tungsten layer and said tungsten-silicide layer until said insulating layer is substantially revealed.

16. The method of claim 15 wherein said tungsten silicide layer is formed by chemical vapor deposition.

17. The method of claim 15 wherein said tungsten layer is formed by chemical vapor deposition.

18. The method of claim 15 wherein said tungsten silicide and said tungsten layer are formed in-situ.

\* \* \* \* \*

UNITED STATES PATENT AND TRADEMARK OFFICE
CERTIFICATE OF CORRECTION

PATENT NO. : 5,604,158
DATED : February 18, 1997
INVENTOR(S) : Cadien et al.

It is certified that error appears in the above-indentified patent and that said Letters Patent is hereby corrected as shown below:

In column 2 at line 23 delete "modem," and insert --modern,--

Signed and Sealed this

Tenth Day of June, 1997

Attest:

BRUCE LEHMAN

Attesting Officer      Commissioner of Patents and Trademarks